United States Patent
Burlock

(10) Patent No.: US 7,351,107 B1
(45) Date of Patent: Apr. 1, 2008

(54) ONE-PIECE ELECTROMAGNETIC SHIELD HAVING MECHANICAL ATTACHMENT FEATURES

(75) Inventor: Donald A. Burlock, Indianapolis, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/648,956

(22) Filed: Jan. 3, 2007

(51) Int. Cl.
*H01R 13/648* (2006.01)

(52) U.S. Cl. ..................... 439/607; 361/752; 439/554

(58) Field of Classification Search ............... 361/816, 361/818, 752, 753; 439/554, 607
See application file for complete search history.

(56) References Cited

U.S. PATENT DOCUMENTS

| | | | | |
|---|---|---|---|---|
| 5,014,160 A | * | 5/1991 | McCoy, Jr. ................. | 361/818 |
| 6,666,694 B1 | * | 12/2003 | Daly et al. ................. | 439/79 |
| 6,824,429 B2 | * | 11/2004 | Hwang ..................... | 439/607 |
| 6,872,880 B2 | * | 3/2005 | King et al. ................. | 174/372 |

* cited by examiner

*Primary Examiner*—Tho D. Ta
*Assistant Examiner*—Travis Chambers
(74) *Attorney, Agent, or Firm*—Jimmy L. Funke

(57) ABSTRACT

A one-piece electromagnetic circuit board shield has a series of depending legs that extend through corresponding slot openings in a circuit board for mechanically retaining the shield in place on the circuit board, and intervening teeth that bite into a peripheral ground plane conductor trace on the circuit board to provide reliable electrical coupling between the shield and the ground plane conductor trace. Some of the depending legs have buckle features that pass through the circuit board slots with resistance to provide a snap-fit attachment of the shield to the circuit board, and other depending legs of the shield are contoured to facilitate a twist-lock functionality that provides a vibration-resistant mechanical lock between the shield and the circuit board.

2 Claims, 3 Drawing Sheets

ONE-PIECE ELECTROMAGNETIC SHIELD HAVING MECHANICAL ATTACHMENT FEATURES

TECHNICAL FIELD

The present invention is directed to electromagnetic shielding for electronic components mounted on a circuit board, and more particularly to a one-piece metal shield designed for mechanical attachment to the circuit board.

BACKGROUND OF THE INVENTION

Electromagnetic shielding is sometimes required for the electronic components of printed circuit board, to prevent externally generated electromagnetic fields from influencing the components and/or to attenuate radiation of electromagnetic fields created by operation of the components. In many cases, the shielding can be accomplished by surrounding the affected components with a sheet metal hood or cover that is conductively coupled to a ground plane of the circuit board. In applications where it is sufficient to shield just one side of the circuit board, a one-piece sheet metal cover dimensioned slightly smaller than the circuit board is positioned on the circuit board and soldered in place. Soldering is used both to electrically couple the shield to the circuit board ground plane and to rigidly secure the shield to the circuit board. The soldering may be accomplished by providing the shield with tabs that extend into plated through-holes in the circuit board, and the circuit board may additionally be provided with a peripheral ground plane conductor trace that is engaged by and soldered to the shield. In applications that require shielding on both sides of the circuit board, a two-piece sheet metal shield may be used to surround the entire circuit board. See, for example, the U.S. Pat. No. 6,872,880 to King et al., assigned to the assignee of the present invention, where a circuit board is sandwiched between two shield halves that snap together with interlocking tabs to eliminate the requirement of soldering the shield to the circuit board. Due to the many manufacturing and re-work difficulties associated with soldering sheet metal shields to circuit boards, and the desire to limit the use of solder in circuit board manufacturing, it would be advantageous to devise a one-piece electromagnetic shield capable of being retained on a circuit board without the use of solder.

SUMMARY OF THE INVENTION

The present invention is directed to an improved one-piece electromagnetic shield for a circuit board. The shield is a sheet-metal cover having a series of depending sidewall legs that extend through corresponding slot-openings in the circuit board for mechanically retaining the shield in place on the circuit board, and intervening teeth that bite into a peripheral ground plane conductor trace on the circuit board to provide reliable electrical coupling between the shield and the ground plane conductor trace. Some of the depending legs have a buckle that passes through the circuit board slots with resistance to provide a snap-fit attachment of the shield to the circuit board, and other depending legs of the shield are contoured to facilitate a twist-lock functionality that provides a vibration-resistant mechanical lock between the shield and the circuit board.

DESCRIPTION OF THE PREFERRED EMBODIMENTS

Figure 1:
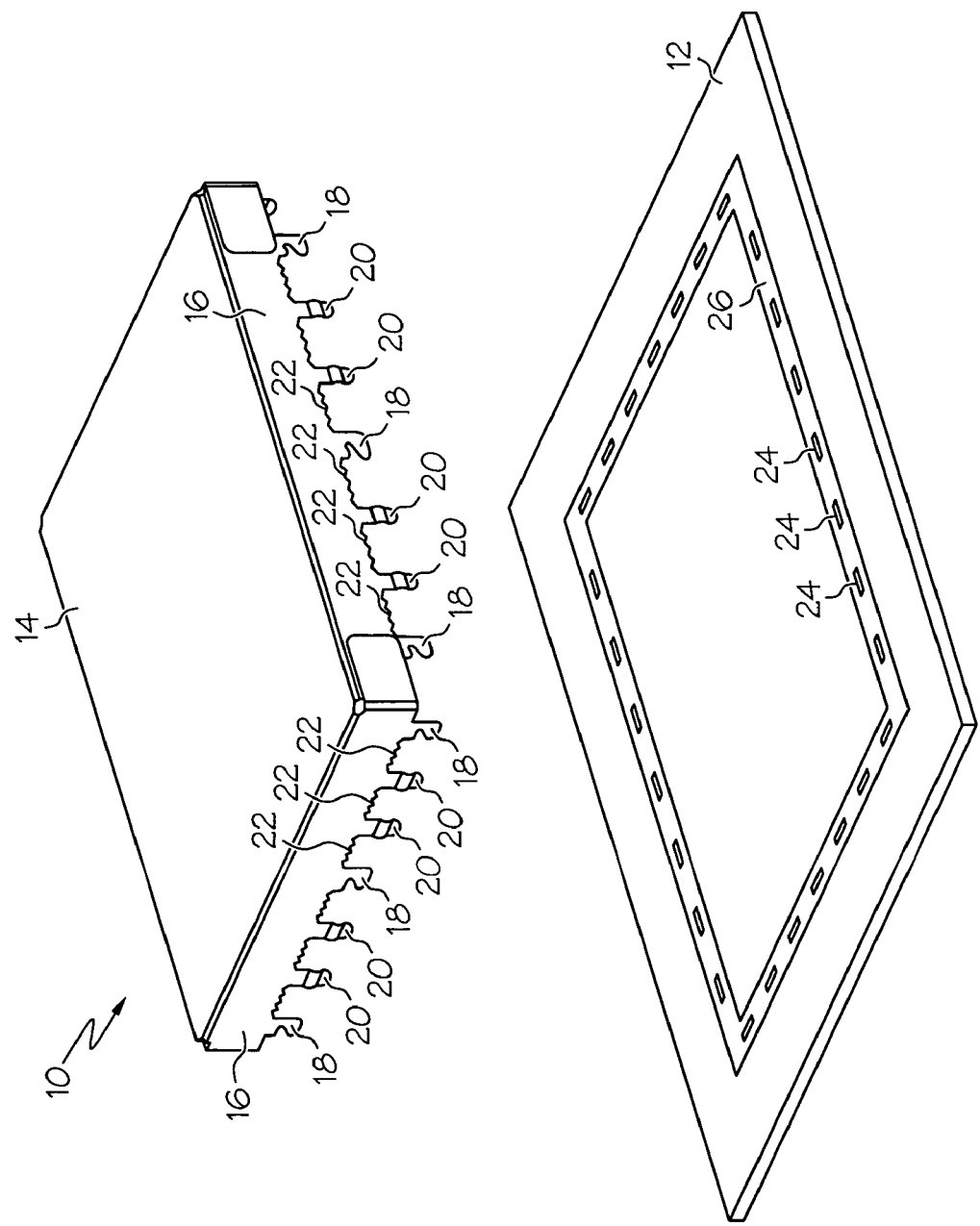
FIG. 1 is an exploded isometric view of a circuit board and a one-piece sheet metal electromagnetic shield according to teachings of the present invention.

Referring to the drawings, and particularly to FIG. 1, the reference numeral 10 generally designates a one-piece electromagnetic shield according to the present invention. The shield 10 is preferably formed of sheet metal as shown, with a top 14 and depending sidewalls 16. The shield 10 is designed for mechanical attachment to a circuit board 12 for the purpose of shielding electronic components (not shown) mounted on circuit board 12 within an area bounded by a peripheral ground plane conductor trace 26. Mechanical attachment of the shield 10 to the circuit board 12 is achieved by providing the shield 10 with a plurality of sidewall legs 18, 20 distributed about its periphery. The legs 18, 20 extend from the sidewalls 16 in a direction away from the top 14 and protrude through corresponding slot openings 24 in circuit board 12 when the shield 10 is positioned on the circuit board 12. The slot openings 24 overlap the ground plane conductor trace 26, and the edges of shield sidewalls 16 between adjacent legs 18, 20 are notched to form teeth 22 that are co-planar with the adjacent legs 18, 20 and that bite into the ground plane conductor trace 26 when the shield 10 is mechanically attached to the circuit board 12.

Figure 2:
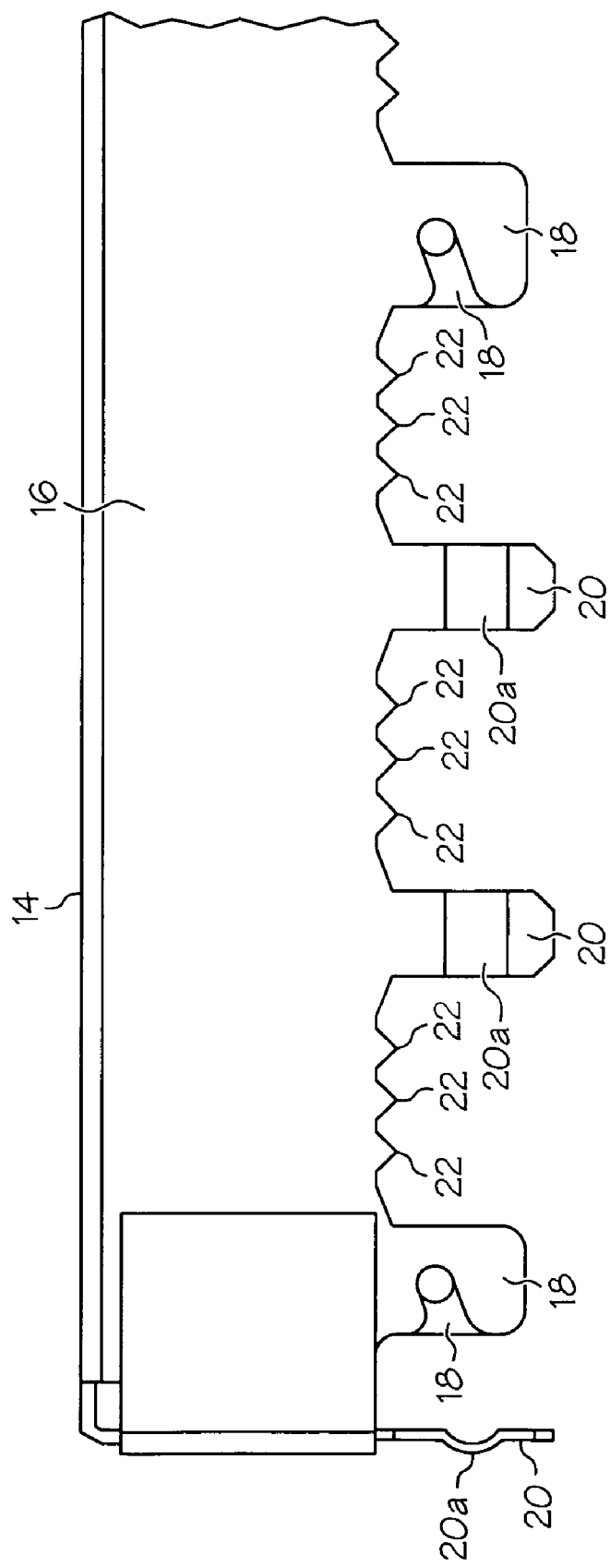
FIG. 2 is an enlarged partial side-view of the electromagnetic shield of FIG. 1.
Figure 3:
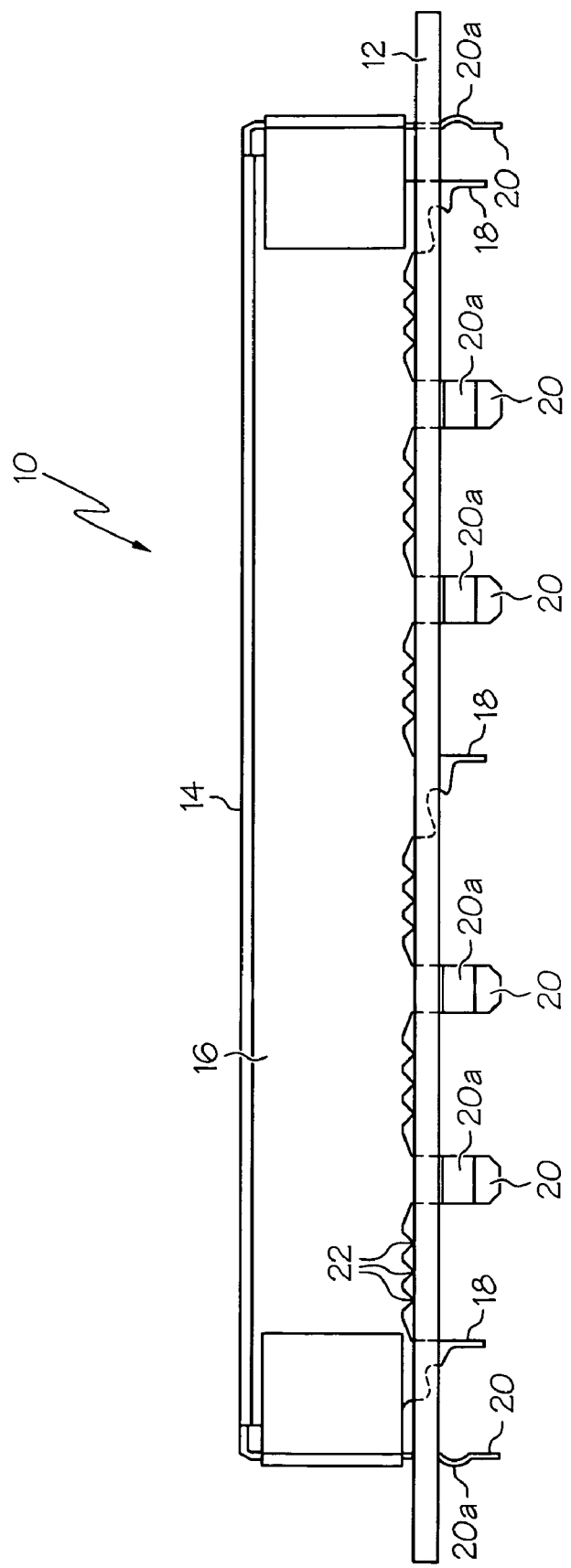
FIG. 3 is a side-view of the electromagnetic shield of FIG. 1, as installed on the circuit board of FIG. 1.

The legs 20 are buckled as indicated in FIGS. 2-3 by the reference numerals 20a to provide a snap-fit of the shield 10 to the circuit board 12 as the buckled portions 20a of the legs 20 pass through the corresponding slot openings 24 of circuit board 12 and lodge against the underside of the circuit board 12. The legs 18, on the other hand, are laterally contoured so that their portion protruding through the circuit board 12 may be twisted as shown in FIG. 3 to provide a vibration-resistant mechanical lock between shield 10 and circuit board 12. The distance between the points of the teeth 22 and the buckled portions 20a of the legs 20 is substantially equal to the thickness of the circuit board 12 so that when the shield 10 is snapped onto the circuit board 12, the teeth 22 bite into the ground plane conductor trace 26.

Although not shown in the drawings, components mounted on the underside of circuit board 12 may be shielded in the same way as described above in respect to the top side—i.e., by providing a second set of slots in circuit board 12 and a bottom-side peripheral ground plane conductor trace similar to the conductor trace 26.

In summary, the present invention provides a one-piece electromagnetic shield 10 that is capable of being mechanically retained on a circuit board 12 with reliable electrical continuity between the shield 10 and a ground plane conductor trace formed on the circuit board, eliminating the customary requirement of soldering the shield to the circuit board. Accordingly, the shield 10 may be installed after the electronic components have been soldered to the circuit board 12, and may be removed without difficulty for rework of the circuit board or its components if necessary.

While the electromagnetic shield of this invention has been described in reference to the illustrated embodiment, it should be understood that various modifications in addition to those mentioned above will occur to persons skilled in the art. For example, the number of legs 18, 20 and teeth 22 may be different than shown herein, and so forth. Accordingly, it is intended that the invention not be limited to the disclosed embodiment, but that it have the full scope permitted by the language of the following claims.

The invention claimed is:

1. A shielded circuit board assembly, comprising:
   a circuit board having a top side, a ground plane conductor trace on the top side defining a peripheral margin, and a plurality of holes formed in the margin; and
   a first electromagnetic shield surrounding electronic components mounted on the top side of the circuit board within said margin, said shield including a sheet metal top that covers the electronic components, depending sidewalls that abut the top side of the circuit board, a first set of sidewall legs having buckles that pass through the holes formed in the margin of the circuit board to provide snap-fit attachment of the shield to the circuit board, a second set of sidewall legs that extend through the holes formed in the margin of the circuit board, including end portions that protrude through the circuit board and are twisted to mechanically lock the shield to the circuit board, and teeth formed in the sidewalls that bite into a the ground plane conductor trace on the top side of the circuit board when said shield is attached to said circuit board to provide electrical coupling between said shield and said ground plane conductor trace.

2. The shielded circuit board assembly of claim 1, where the circuit board has a bottom side, and the assembly further comprises:
   a second electromagnetic shield attached to the bottom side of the circuit board.

* * * * *